United States Patent
Lo et al.

[11] Patent Number: 6,093,589
[45] Date of Patent: Jul. 25, 2000

[54] METHODS FOR PREVENTING GATE OXIDE DEGRADATION

[75] Inventors: Guo-Qiang (Patrick) Lo, San Jose; Shih-Ked Lee, Fremont, both of Calif.

[73] Assignee: Integrated Device Technology, Inc., Santa Clara, Calif.

[21] Appl. No.: 08/928,429

[22] Filed: Sep. 12, 1997

Related U.S. Application Data

[62] Division of application No. 08/644,468, May 10, 1996, Pat. No. 5,767,558.

[51] Int. Cl.$^7$ .................. H01L 21/336; H01L 21/3205
[52] U.S. Cl. .................. 438/197; 438/592; 438/647; 438/655
[58] Field of Search .................. 438/197, 592, 438/585, 647, 652, 655, 682, 229

[56] References Cited

U.S. PATENT DOCUMENTS

| | | | |
|---|---|---|---|
| 4,816,425 | 3/1989 | McPherson | 438/592 |
| 4,886,764 | 12/1989 | Miller et al. | 438/592 |
| 4,897,368 | 1/1990 | Kobushi et al. | 438/592 |
| 5,164,333 | 11/1992 | Schwalke et al. | 437/200 |
| 5,214,305 | 5/1993 | Huang et al. | 257/413 |
| 5,256,894 | 10/1993 | Shino | 257/388 |
| 5,274,261 | 12/1993 | Chen | 257/344 |
| 5,364,803 | 11/1994 | Lur et al. | 438/592 |
| 5,371,396 | 12/1994 | Vinal et al. | 257/412 |
| 5,425,392 | 6/1995 | Thakur et al. | 438/655 |
| 5,710,454 | 1/1998 | Wu | 257/413 |

*Primary Examiner*—Michael Trinh
*Attorney, Agent, or Firm*—Skjerven Morrill MacPherson Franklin & Friel

[57] ABSTRACT

The degradation of integrity of the gate oxide in a CMOS transistor due to the formation of a tungsten silicide strapping layer on the polycrystalline silicon gate as a result of the migration of fluorine atoms from the tungsten hexafluoride used to form the tungsten silicide is reduced by increasing the dopant concentration of the polycrystalline silicon layer thereby to form dopant atoms in the grain boundaries of the polycrystalline silicon to block the migration of fluorine through the polycrystalline silicon to the underlying gate oxide. By preventing fluorine from reaching the gate oxide in this manner, the degradation of the gate oxide due to the replacement of oxygen by fluorine is decreased. The method maintains the gate-oxide integrity (such as charge-to-breakdown characteristics), and the method also makes more predictable the performance of the resulting transistors by reducing the thickening of the oxide due to the migration of oxygen replaced by fluorine into the underlying silicon substrate thereby to form additional silicon oxide. The polysilicon thus preserves the gate oxide integrity. In addition, the heavily-doped polysilicon will also sufficiently dope the contacted polysilicon and thus reduce the contact resistance of the polycrystalline silicon and silicon.

9 Claims, 2 Drawing Sheets

METHODS FOR PREVENTING GATE OXIDE DEGRADATION

This application is a division of application Ser. No. 08/644,468, filed May 10, 1996, now issued as U.S. Pat. No. 5,767,558.

FIELD OF INVENTION

This invention relates to the fabrication of MOS and CMOS semiconductor devices, and in particular, to methods of fabricating such devices, that minimize the contamination and degradation of the devices' polycrystalline silicon gates as a result of the formation of metal strappings on the polycrystalline silicon gates.

BACKGROUND OF INVENTION

In certain processes for the formation of the conductive gates used to control the N channel and P channel transistors which make up CMOS devices, a polycrystalline silicon material is deposited on a gate oxide to form a portion of each transistor's gate. Following the formation of the polycrystalline silicon, a layer of tungsten silicide ($WSi_x$) is deposited on the polycrystalline silicon to form a metal strapping to reduce the overall impedance of the gate structure (and thus increase the speed of the device). Typically, the tungsten silicide is formed by chemical vapor deposition using tungsten hexafluoride ($WF_6$) and silane ($SiH_4$). The tungsten silicide that deposits on the polycrystalline silicon contains fluorine atoms that upon annealing migrate into the polycrystalline silicon and the underlying gate oxide.

Unfortunately, some of the fluorine atoms also displace oxygen atoms in the underlying gate oxide ($SiO_2$) and destroy the gate-oxide bonding structure. First, some of these displaced oxygen atoms may enter into the silicon underlying the gate oxide. These oxygen atoms then combine with the silicon underlying the gate oxide to cause the gate oxide to become thicker. As a result, the process of forming the tungsten silicide metal strapping on the gate electrode destroys the integrity of the original gate oxide and thus changes the performance characteristics of the resulting device. For example, the thickening of the gate oxide may uncontrollably, and thus undesirably, change (usually increase but sometimes decrease) the threshold voltage of the resulting device. A change in the threshold voltage of the resulting device is undesirable because it increases yield loss and makes it difficult to predict the performance of the resulting circuits formed using the resulting device. In general it is undesirable to have a threshold voltage for an MOS device which is other than predicted from design considerations. Second, the altered gate-oxide structure will have much degraded charge-to-breakdown and breakdown voltage characteristics.

The prior art did not address these problems. The prior art was directed solely to depositing a $WSi_x$ metal strapping onto the polycrystalline silicon layer and made no attempt to correct the device degradation problems. Although $WSi_x$ physical vapor deposition (such as sputtering deposition) can have no fluorine problem, because of its poor step-coverage this $WSi_x$-method is less preferred than the chemical vapor deposition method.

The prior art has several disadvantages. For example, (1) the prior art does not maintain the gate-oxide integrity, i.e., it has a lower charge-to-breakdown and breakdown voltage. (2) The final gate oxide is thicker than desired; thus the threshold voltage is uncontrollable and unpredictable across process runs. And (3) when the process is performed ex-situ (breaking the vacuum of the semiconductor fabrication chamber after forming the gate-oxide and polycrystalline silicon regions), an extra step is required to clean the native oxide that forms on the semiconductor device before forming the strapping on the polycrystalline gate.

SUMMARY OF THE INVENTION

In accordance with the present invention, semiconductor devices are fabricated in a manner that significantly reduces the diffusion into the polycrystalline silicon gate material of fluorine atoms from the gases used to deposit the metal strapping. In accordance with the present invention, the reduction in the diffusion into the polycrystalline silicon gate material of fluorine atoms is achieved by forming a heavily-doped polycrystalline silicon gate. By heavily doping the polycrystalline silicon gate material, the grain boundaries of the polycrystalline silicon contain dopant atoms thereby allowing fewer fluorine atoms to diffuse through the polycrystalline silicon film. This reduces the effect of fluorine on the underlying gate oxide and thus reduces the degradation and the thickening of the gate oxide compared to the prior art processes. In addition, the heavily-doped polycrystalline silicon contains sufficient dopant to dope the portion of the silicon substrate contacted by the polycrystalline silicon gate thereby resulting in lower contact resistance between the polycrystalline silicon gate material and the underlying silicon substrate. In addition, the reduction in the flow rate of the tungsten hexafluoride ($WF_6$) used together with silane ($SiH_4$) to form tungsten silicide ($WSi_x$) results in fewer fluorine atoms available to penetrate into the gate oxide and thus reduces the integrity degradation and the thickening of the gate oxide. Furthermore, the use of in-situ deposition to form the tungsten silicide ($WSi_x$) makes it possible to use heavily-doped polycrystalline silicon material for the gate and then stack on top of the heavily-doped polycrystalline silicon material a chemical vapor deposited tungsten silicide ($WSi_x$) without having a tungsten silicide ($WSi_x$) film lifting problem. The lifting problem in the prior art was caused by the formation of native oxide on the polycrystalline silicon when the polysilicon film is exposed to ambient air, which reduced the adherence of the tungsten silicide ($WSi_x$) to the underlying polycrystalline silicon and thereby prevented a strong bond from forming between the two materials.

The present invention thus has several advantages over the prior art. First, the dopant atoms in the polycrystalline silicon more fully fill the grain boundaries of the semiconductor device, and accordingly, during subsequent annealing of the device fewer fluorine atoms are able to flow across the polycrystalline silicon and into the substrate; this results in less thickening of the gate-oxide region and less gate-oxide degradation. The heavily doped polycrystalline silicon will also readily dope the contacted silicon region, thus reducing the contact resistance between the silicon and polysilicon. Second, because the flow rates of the gases used for the deposition of tungsten silicide ($WSi_x$) are decreased, fewer fluorine atoms diffuse into the underlying substrate. Third, by using in-situ deposition, heavily-doped polycrystalline silicon can be used for the gate without a resultant degradation in the adhesion between the $WSi_x$ metal strapping film and the polycrystalline silicon (the "$WSi_x$ lifting problem") caused by the formation of native oxide on the polycrystalline silicon when this silicon is exposed to the atmosphere as in the prior art.

In accordance with one embodiment of this invention, after the gate oxide is grown onto a semiconductor substrate, a threshold adjustment implant is formed over the wafer.

Following the implant, the wafer is annealed to activate the implanted dopant atoms in the underlying channel regions of the to-be-formed transistors. A highly-doped polycrystalline silicon layer is next deposited onto the gate-oxide. The polycrystalline silicon is deposited using silane with very high flow of phosphine ($PH_3$) in a hydrogen ($H_2$) carrier gas at a given temperature. In accordance with this invention, the phosphine ($PH_3$) flow should be as high as possible, such that the resulting sheet resistance of the polycrystalline silicon gate is made as low as possible. The pressure at which the polycrystalline gate layer is formed should also be slightly increased, since in a single wafer chemical vapor deposition chamber, the deposition rate is increased with higher pressure. So by use of a high-flow phosphine ($PH_3$) gas at slightly increased chamber pressure, the deposition rate is not reduced but the resulting deposited polycrystalline silicon has a high dopant concentration. The metal strapping is then deposited in-situ (i.e., without breaking the vacuum enclosing the fabrication process). In accordance with one embodiment of this invention, the metal strapping is tungsten silicide ($WSi_x$) which is deposited using silane ($SiH_4$) with low flow rate tungsten hexafluoride ($WF_6$) at a given temperature in Argon (Ar) as the carrier gas.

In accordance with a second embodiment of this invention, after the gate oxide region is grown onto the underlying substrate and any threshold adjustment implant and subsequent anneal completed, a highly-doped polycrystalline silicon layer is deposited onto the wafer. A lightly-doped polycrystalline silicon layer of the same dopant type is next deposited onto the first polycrystalline silicon layer. The first, highly-doped layer retards the diffusion of fluorine atoms into the underlying substrate. The second, lightly-doped layer buffers the first layer from the metal strapping and thus minimizes any reaction between the metal strapping and the first layer during and after the formation of the metal strapping. Because this method incorporates an added CVD step, the process may take longer due to the additional time needed to stabilize the gases used to deposit the lightly doped polycrystalline silicon layer.

This second embodiment advantageously solves problems encountered in the prior art when the polycrystalline silicon gate is doped ex-situ resulting in possible disadvantageous reactions between the heavily doped polycrystalline silicon and $WSi_x$. When the gate is so doped, a native oxide layer is formed on the polycrystalline silicon layer as the wafer is moved through the atmosphere from the chamber in which the polycrystalline silicon is formed to the chamber in which the polycrystalline silicon is doped. The formation of this native oxide layer is accelerated when the concentration of the phosphorus dopant atoms in the polycrystalline silicon is high. This native oxide layer increases the resistance between the polycrystalline silicon and any metal strapping, and also weakens the adherence between the two, which causes lifting of the metal strapping.

The native oxide layer can be further decreased or eliminated using standard dry or wet cleaning techniques, but might not be completely cleaned if heavily doped polysilicon is used instead of the traditional lightly doped polysilicon film.

DESCRIPTION OF THE PREFERRED EMBODIMENTS

Figure 1:
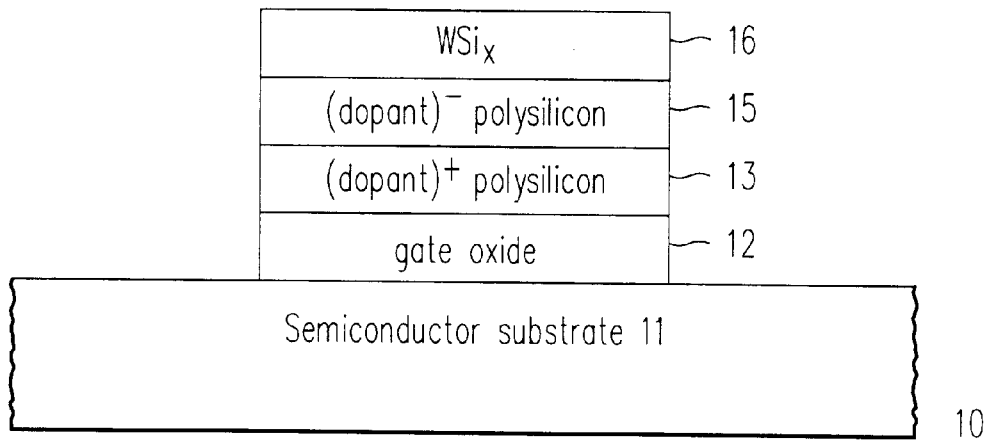
FIG. 1 is a drawing of one embodiment of the present invention, illustrating a semiconductor device fabricated using a lightly-doped polycrystalline silicon layer formed on a highly-doped polycrystalline silicon layer.

FIG. 1 illustrates one embodiment of this invention. FIGS. 2a through 2d depict one method to form the device in FIG. 1. Gate oxide region 12 is thermally grown in a conventional way onto semiconductor substrate 10, to a thickness of approximately 60 to 200 Å, using dry $O_2$ or wet $H_2O$ (steam). (See FIG. 2a.) Next, a polycrystalline silicon layer with n-type dopant 13 is formed on the gate-oxide region to a thickness of approximately 500 Å (typically by CVD using silane ($SiH_4$) and phosphine ($PH_3$) in hydrogen ($H_2$) carrier gas). (See FIG. 2b.) In the preferred embodiment, the phosphine ($PH_3$) flow rate is at least 250 SCCM, the silane flow rate is 490 SCCM, and the hydrogen carrier gas flow rate is about 600 SCCM. These flow rates yield a dopant concentration in the first layer of about $10^{21}$ atoms/cc or higher of phosphorus. Arsenic can be used as the dopant in place of phosphorus, if desired.

A more lightly n-type doped polycrystalline silicon layer 15 is next deposited to a thickness of approximately 1000 Å on polycrystalline layer 13. (See FIG. 2c.) In the preferred embodiment, the phosphine ($PH_3$) and silane ($SiH_4$) are used with hydrogen ($H_2$) as the carrier gas to form polycrystalline silicon layer 15 with a phosphorus doping concentration of approximately $3 \times 10^{20}$ atoms/cc. The $H_2$ and $SiH_4$ flow rates used to deposit this lightly-doped polycrystalline silicon layer are the same as those used to deposit the more highly-doped polycrystalline silicon layer.

Finally, a tungsten-silicide ($WSi_x$) layer 16 is formed on top of polycrystalline silicon layer 15 to a thickness of approximately 1000 to 1800 Å. (See FIG. 2d.) The tungsten silicide ($WSi_x$) layer 16 is deposited using nitrogen ($N_2$) or Argon (Ar) carrier gas, tungsten hexafluoride ($WF_6$) and silane ($SiH_4$). The concentration of tungsten to silicon is dependent on the device fabrication, but may be 1:approximately 2.5 to 2.8.

The wafer is next cleaned using dry methods such as vapor HF, for example, or by using diluted hydrofluoric acid (e.g., 100:1) on the polycrystalline silicon film before the $WSi_x$ deposition.

Should the wafer be removed from the reaction chamber after the formation of polycrystalline silicon layer 15 and passed through the atmosphere to another chamber for the formation of tungsten silicide layer 16, a native oxide layer will form on polycrystalline silicon layer 15. To improve the adherence of the to-be-formed tungsten silicide layer 16 on polycrystalline silicon layer 15, the native oxide is removed either by a vapor-HF or a wet (such as diluted HF) solution. Tungsten silicide is then formed on the just cleaned polycrystalline silicon layer 15. Because native oxide forms more quickly when more heavily doped polysilicon is exposed to air, some native oxide will always grow on the polysilicon (such as the heavily-doped polysilicon) after it is cleaned and before it is placed in the tungsten silicide reactor and/or the atmosphere is removed from the load lock.

Figure 3:
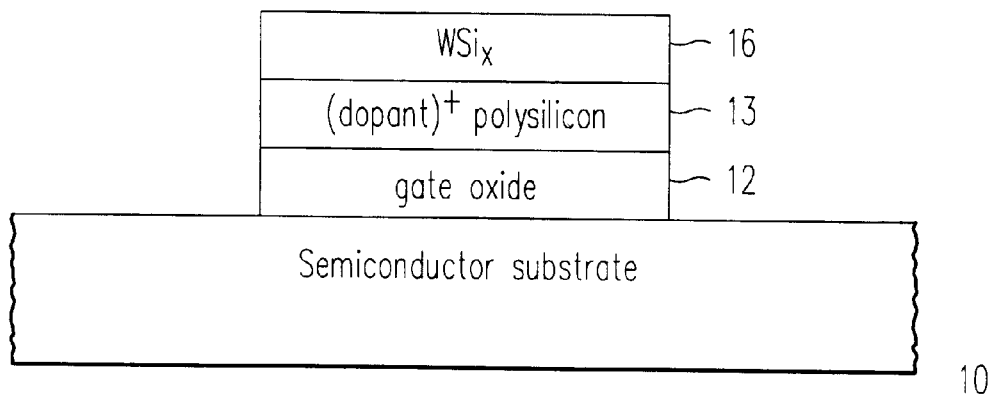
FIG. 3 is a drawing of a second embodiment of the present invention, illustrating a semiconductor device fabricated using one highly-doped polycrystalline silicon layer.
Figure 2A:
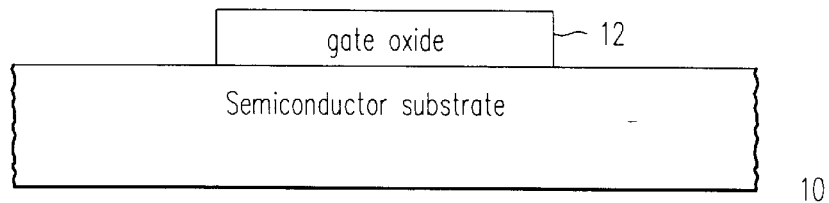
FIGS. 2a through 2d show the sequence of steps required to produce the device of FIG. 1.
Figure 2B:
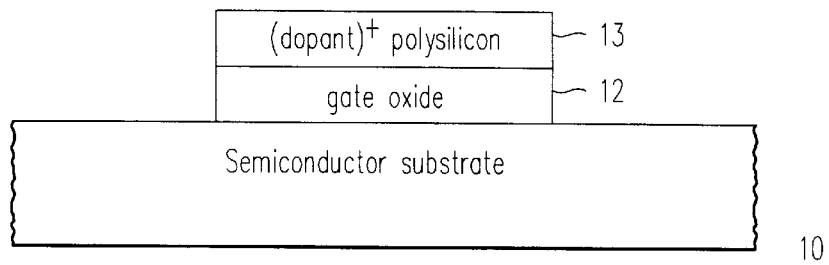
Figure 2C:
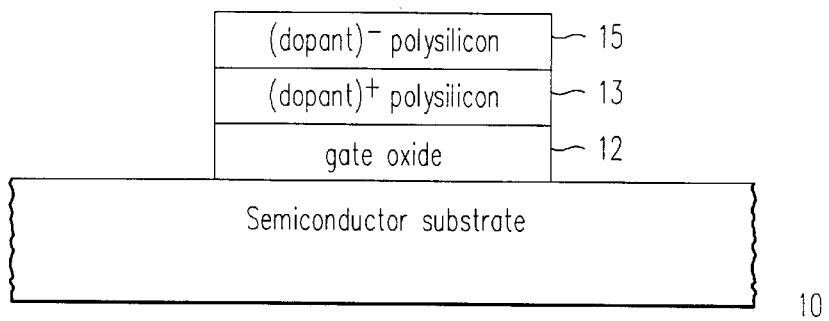
Figure 2D:
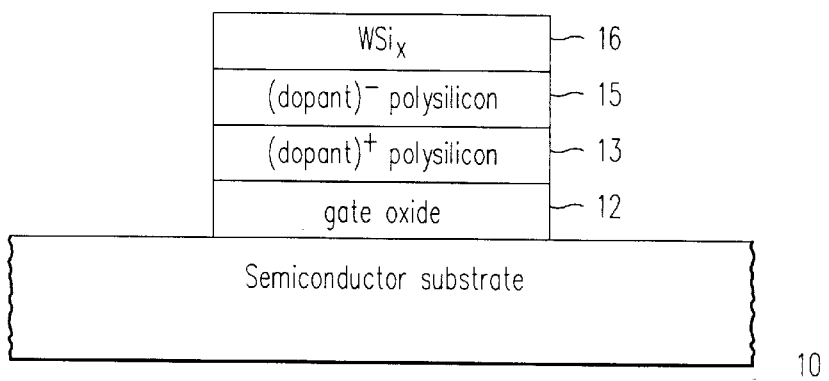

FIG. 3 illustrates a second embodiment of the present invention. (One method to form this embodiment is similar to that depicted in FIGS. 2a through 2d; layer 15, however, is eliminated here.) Polycrystalline silicon layer 13 is fabricated in the same way as polycrystalline layer 13 in the device of FIG. 1, with the same gas-flow rates. In this embodiment, however, only one, highly-doped, polycrystalline silicon layer 13, with a dopant concentration of at least $10^{21}$ atoms/cc is used. Layer 13 uses either phosphorous or arsenic as the dopant atoms and is approximately 1500 Å in thickness.

The invention causes the dopant in the polycrystalline silicon layer 13 to form heavily in the grain boundaries of the polycrystalline silicon thereby blocking fluorine from passing through the polycrystalline silicon layer 13 into the underlying gate oxide 12. Accordingly, the fluorine incorporated in the tungsten silicide film during the formation of tungsten silicide is substantially blocked from passing into gate oxide 12. Thus, gate oxide 12 does not lose oxygen atoms to the underlying semiconductor substrate 11 thereby preventing silicon oxide from forming beneath and directly adjacent to gate oxide 12 in substrate 11 and thus preventing the thickening of the gate oxide. Accordingly, the resulting structure has more highly predictable performance and higher yield than the prior art structure. Importantly, the gate-oxide integrity is maintained.

Although the present invention has been described with reference to particular embodiments, the description is exemplary only and not limiting. Various adaptations and combinations of features of the embodiments disclosed will be apparent to those skilled in the art and are within the scope of the present invention as defined by the following claims.

We claim:

1. A method of fabricating a semiconductor device which comprises:

forming a gate oxide layer on a semiconductor substrate;

forming at least one polycrystalline silicon layer over said gate oxide layer, said at least one polycrystalline silicon layer being formed with a dopant concentration of at least $10^{21}$ atoms/cc to thereby reduce transmission of fluorine through the at least one polycrystalline silicon layer to the underlying gate oxide layer; and forming a metal silicide layer over said at least one polycrystalline silicon layer using a compound including fluorine.

2. The method of claim 1, wherein said forming at least one polycrystalline silicon layer comprises:

forming a first polycrystalline silicon layer having a first dopant concentration over said gate oxide layer; and forming a second polycrystalline silicon layer having a second dopant concentration over said first polycrystalline silicon layer, wherein said second dopant concentration is less than said first dopant concentration.

3. The method of claim 2 wherein said gate oxide layer is thermally grown to a thickness of approximately 60 to 200 Å.

4. The method of claim 2 wherein said second polycrystalline silicon layer has a dopant concentration of approximately $3 \times 10^{20}$ atoms/cc.

5. The method of claim 2 wherein said metal silicide layer comprises tungsten silicide formed using a compound including fluorine.

6. The method of claim 5 wherein the tungsten silicide comprises a ratio of W atoms to Si atoms of 1:approximately 2.5 to 2.8.

7. The method of claim 1 wherein said gate oxide layer is thermally grown to a thickness of approximately 60 to 200 Å.

8. The method of claim 1 wherein said metal silicide layer comprises tungsten suicide formed using a compound including fluorine.

9. The method of claim 8 wherein the tungsten silicide comprises a ratio of W atoms to Si atoms of 1:approximately 2.5 to 2.8.

* * * * *